(12) United States Patent
Chamberlin et al.

(10) Patent No.: US 10,470,290 B2
(45) Date of Patent: Nov. 5, 2019

(54) COATING FOR LIMITING SUBSTRATE DAMAGE DUE TO DISCRETE FAILURE

(71) Applicant: International Business Machines Corporation, Armonk, NY (US)

(72) Inventors: Bruce J. Chamberlin, Vestal, NY (US); Scott B. King, Rochester, MN (US); Joseph Kuczynski, North Port, FL (US); David J. Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/589,153

(22) Filed: May 8, 2017

(65) Prior Publication Data

US 2018/0324944 A1 Nov. 8, 2018

(51) Int. Cl.
| | |
|---|---|
| *H05K 3/30* | (2006.01) |
| *H05K 7/20* | (2006.01) |
| *H01L 23/00* | (2006.01) |
| *C09K 5/00* | (2006.01) |
| *C09K 5/06* | (2006.01) |

(Continued)

(52) U.S. Cl.
CPC ........... *H05K 1/0201* (2013.01); *H05K 1/181* (2013.01); *H05K 3/3431* (2013.01); *H05K 2201/10575* (2013.01); *H05K 2203/175* (2013.01); *H05K 2203/176* (2013.01)

(58) Field of Classification Search
CPC . H05K 3/30; H05K 7/20; H05K 7/209; H01L 23/00; C09K 5/00; C09K 5/06; C09K 5/063

USPC ........ 174/250, 259, 260; 361/704; 29/592.1, 29/890.03; 257/E23.089
See application file for complete search history.

(56) References Cited

U.S. PATENT DOCUMENTS

| | | | | |
|---|---|---|---|---|
| 3,669,921 A | * | 6/1972 | Droke | ................. C08G 63/183 |
| | | | | 524/394 |
| 5,154,793 A | * | 10/1992 | Wojnarowski | ...... B29C 63/0013 |
| | | | | 156/229 |

(Continued)

FOREIGN PATENT DOCUMENTS

| | | |
|---|---|---|
| JP | 11067981 | 3/1999 |
| WO | 2016021646 | 2/2016 |

OTHER PUBLICATIONS

Wong et al., Swelling and Time-Dependent Subcritical Debonding of Underfill During Temperature-Humidity Aging of Flip Chip Packages, IEEE Transactions on Components and Packaging Technologies, vol. 28, No. 4, Dec. 2005, pp. 862-868.

(Continued)

*Primary Examiner* — Xiaoliang Chen
(74) *Attorney, Agent, or Firm* — Lieberman & Brandsdorfer, LLC

(57) ABSTRACT

An apparatus is configured with a component having a coating comprising a material in a first phase (e.g., solid and/or liquid phase) with a transition temperature. The component is mechanically and/or electrically attached to a substrate. Exposure of the coating to a temperature that meets or exceeds the transition temperature causes the material to undergo a phase change. The phase change of the material alters the position of the component, including separation of the component from the substrate. The separation disrupts the attachment, thereby mitigating damage to the substrate and/or component.

20 Claims, 3 Drawing Sheets

(51) Int. Cl.
*H05K 1/02* (2006.01)
*H05K 1/18* (2006.01)
*H05K 3/34* (2006.01)

(56) References Cited

U.S. PATENT DOCUMENTS

| | | | | |
|---|---|---|---|---|
| 5,780,192 | A * | 7/1998 | O'Regan | G03G 5/056 430/59.6 |
| 6,053,719 | A * | 4/2000 | Barbier | D04H 3/011 425/131.5 |
| 6,286,212 | B1 * | 9/2001 | Eaton | C09K 5/06 165/185 |
| 7,047,633 | B2 * | 5/2006 | Morganelli | H01L 21/563 174/259 |
| 7,109,722 | B2 | 9/2006 | Chamberlin et al. | |
| 7,312,261 | B2 | 12/2007 | Sachdev et al. | |
| 7,393,419 | B2 | 7/2008 | Sachdev et al. | |
| 7,405,247 | B2 | 7/2008 | Sachdev et al. | |
| 9,508,680 | B1 * | 11/2016 | Ayotte | H01L 24/98 |
| 2001/0020697 | A1 * | 9/2001 | Takeichi | C09J 163/00 252/512 |
| 2002/0042995 | A1 * | 4/2002 | Eaton | C09K 5/06 29/890.03 |
| 2007/0184582 | A1 * | 8/2007 | Nakamura | H01L 24/75 438/108 |
| 2010/0183983 | A1 * | 7/2010 | Takayama | G03F 9/708 430/311 |
| 2010/0273642 | A1 * | 10/2010 | Chang | B01J 31/069 502/167 |
| 2015/0077941 | A1 * | 3/2015 | Hosseini | H01L 23/3733 361/704 |
| 2016/0046845 | A1 | 2/2016 | Das et al. | |

OTHER PUBLICATIONS

Maobai et al., Synthesis of Tertiary Ester Epoxy Resin and Application in Reworkable Underfill, 14th International Conference on Electronic Packaging Technology, 2013, pp. 196-199.

Banakar et al., Protecting your Low Voltage Electronic Devices from Electrical Overstress, Cypress Semiconductor, Nov. 2, 2013, pp. 1-9.

Hillman, Improved Methodologies for Identifying Root-Cause of Printed Board Failures, DfR Solutions, College Park, MD, Mar. 18, 2005, pp. 1-18.

Unknown, 3 Most common PCB Assemnly Defects, Optimum Design Associates Blog, Jan. 2016.

List of IBM Patents or Applications Treated as Related, May 2017.

* cited by examiner

COATING FOR LIMITING SUBSTRATE DAMAGE DUE TO DISCRETE FAILURE

BACKGROUND

The present embodiments relate generally to mitigating damage to a substrate. More specifically, the embodiments relate to a material to facilitate separation of a failing component from the substrate prior to the substrate and/or failing component experiencing damage.

The substrate is configured to support electronics and/or electrical energy. An example of the substrate comprised of a conducting material includes, but is not limited to, a printed circuit board (PCB). The conducting material is utilized to electronically connect components operatively coupled to the substrate, such as resistors, capacitors, and other devices. Exposure of the substrate to damage may require replacement of the substrate. Similarly, exposure of one or more of the connected components to damage may require replacement of the affected component(s), one or more proximally positioned components, and/or in some circumstances the substrate.

It is understood that a discrete component in communication with the substrate may experience a failure, such as an electrical short which causes excess current to be driven through the discrete component and/or the substrate. Excess current leads to resistive heating and subsequent thermal runaway leading to smoke, fire, failure of the component, failure of a PCB trace, failure of the PCB, and/or damage to the surrounding devices.

SUMMARY

The disclosed embodiments pertain to mitigating potential damage to a discrete component and/or a proximally positioned substrate by utilizing a material to separate the failing component from the substrate prior to the substrate experiencing damage.

In one aspect, an apparatus is provided in the form of a component adapted to be operatively coupled to a substrate in a first position. A coating is applied to the component, and the component with the applied coating is positioned adjacent to the substrate. The coating comprises a material configured to be subject to a phase change. In a first phase, the material is below an associated transition temperature. Responsive to exposure of the material to a thermal event meeting or exceeding the transition temperature, the material changes from the first phase to a second phase. The phase change to alter a position of the component relative to the substrate from the first position to a second position. The position change includes a separation of the component from the substrate.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments, unless otherwise explicitly indicated.

DETAILED DESCRIPTION

Figure 1:
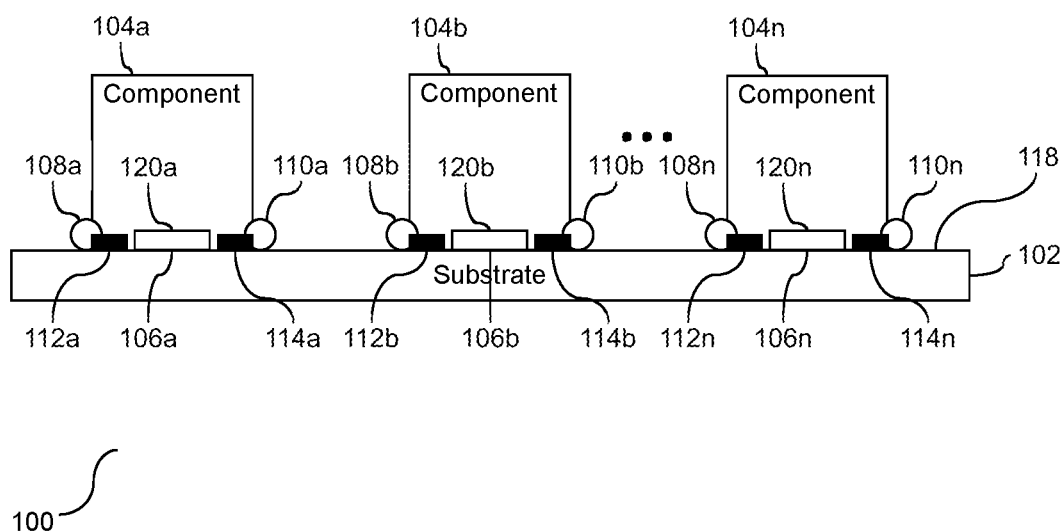
FIG. 1 depicts a block diagram illustrating application of a coating to a discrete component, and positioning of the component proximal to an associated substrate in a first position.

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Unless the meaning is clearly to the contrary, all references made herein to ranges are to be understood as inclusive of the endpoints of the ranges. The modifier "about" used in connection with a quantity is inclusive of the stated value and has the meaning dictated by the context (e.g., includes the degree of error associated with measurement of the particular quantity). Unless the meaning is clearly to the contrary, all references made herein to pressures, such as psi, are to be understood as relative to atmospheric pressure.

Exposure of a substrate and/or a component positioned proximal to the substrate to a critical temperature can cause damage to the substrate and/or the component. Effects of the exposure may include, but are not limited to, fire, smoke, spark, functionality loss, and/or deformation. In one embodiment, the component(s) and the substrate may have a critical temperature, with exposure to the critical temperature leading to damage. Examples of the critical temperature include, but are not limited to, exposure above about 1000 degrees Celsius and exposure above about 500 degrees Celsius. Different components comprised of different materials may have separate and unique critical temperatures. For example, $component_0$ may have a first critical temperature, $temperature_0$, and $component_1$ may have a second critical temperature, $temperature_1$, with $temperature_0$ and $temperature_1$ being different. Similarly, a substrate in communication with both $component_0$ and $component_1$ may have a third critical temperature, $temperature_2$, that is different from $temperature_0$ and $temperature_1$. In one embodiment, at least one of the components or substrate may have a matching critical temperature. In one embodiment, individual components in communication with the substrate may have separate critical temperatures. Similarly, in one embodiment, the critical temperature of the substrate may be separate from the critical temperature(s) of the components in communication with the substrate. In one embodiment, the critical temperature may be selected from a lowest critical temperature of each of the components and the substrate. Accordingly, the critical temperature is a characteristic of the component(s) and/or substrate at which they are subject to failure.

A temperature increase on the substrate and/or component(s) may be caused by a variety of different factors, including but not limited to a high current event and/or an electrical short. High current through a conductor on the substrate or in one of the components in communication with the substrate can lead to resistive heating causing temperature increases in the substrate and thermal runaway. For example, the thermal runaway may be an increase in temperature of the conductor experiencing the high current which leads to an increase in resistance of the conductor which causes further increases in temperatures.

The electrical short may be caused by, but is not limited to, a component operatively coupled to the substrate, solder bridging, and/or a component shift. The component operatively coupled to the substrate may have a short (e.g., lower resistance) leading to excessive heating within the component and resultant thermal runaway. Solder bridging occurs when solder connects two conductors which were not designed to be connected together and causes a lower resistance path (e.g., an electrical short) for an electrical circuit. The component shift is when the component is misaligned with the electrical interface on the substrate due to movement of the component. For example, the component may shift from a first position to a second position during a solder reflow process. Accordingly, either an electrical short or a high current event can lead to damage of the substrate and/or component operatively coupled to the substrate.

Damage (e.g., burns) to the substrate and/or operatively coupled component includes, but is not limited to, smoke, fire, failure of the component, failure of a portion of the substrate, failure of the entire substrate, and/or damage to surrounding devices. In one embodiment, damage may be caused by a discrete failure of a single component, and the substrate may continue to function without the failing component. Accordingly, if the failure of the failing component can be mitigated prior to causing damage to the substrate and/or other component(s), the damage caused by the failure is limited, or in one embodiment isolated, and the substrate may remain operational and/or repairable.

Solutions to limit damage to the substrate due to a discrete failure are provided, with embodiments directed at an apparatus and method as discussed below in detail. As shown and described, the apparatus is configured with a component configured with a coating having a material, that is subject to phase changes. In a first phase, the material is in a first phase (e.g., solid or liquid phase). The material has an associated transition temperature, and at such time as the material is exposed to the transition temperature, the material changes from the first phase to a second phase, and effectively changes form. In one embodiment, the transition temperature is above a first temperature and below a critical temperature. In one embodiment, the first temperature is a reflow temperature of an assembly of the component and the substrate. It is understood that solder may be employed to mechanically and/or electrically attach electronic components to a printed circuit board (PCB). With that in mind, the first temperature may be a liquidus temperature of an associated solder material employed to operatively bond the component to the substrate such that the first temperature weakens the mechanical attachment created by the solder.

Exposure of the coating to a thermal event that meets or exceeds the transition temperature causes the material to undergo a phase change from the first phase (e.g., solid and/or liquid) to a gaseous phase. In one embodiment, the thermal event is an increase in temperature that meets or exceeds a first temperature caused by an electrical short. In one embodiment, the electrical short is in the component. The phase change alters a physical position of the component in relation to the substrate. More specifically, prior to the phase change, the component is in a first position in relation to the substrate, and after the phase change, the component is in a second position in relation to the substrate. In the first position, the component is mechanically and/or electrically coupled to the substrate; in the second position, the component is mechanically and/or electrically separated from the substrate. The separation of the component in the second position may be a partial separation or a complete separation. Regardless of the quantity of the separation, there is a disruption of the flow of the electrical energy (e.g., decrease in current) between the component and the substrate, with the disruption mitigating additional temperature increase of the component and/or substrate. In one embodiment, the disruption limits damage to the discrete component and/or localized area. In one embodiment, the second position is an indication that the component has experienced a failure, thereby facilitating the process of locating and/or identifying the failing component. Accordingly, application of the coating to the component effectively integrates the coating with the component, and functions to mitigate damage to the substrate and/or component responsive to the thermal event.

Referring to FIG. 1, a block diagram (100) is provided illustrating application of a coating to a discrete component, and positioning of the component proximal to an associated substrate. As shown, there are a plurality of adjacently positioned components (104a), (104b), and (104n), each operatively coupled to the substrate (102). More specifically, each of the components (104a)-(104n) is shown herein in a first position relative to the substrate (102). The components may be, but are not limited to, a resistor, a capacitor, an optoelectronic device, an oscillator, a connector, a potentiometer, an integrated circuit, a sensor, a transducer, a relay, a switch, a driver, a motor, a power supply, a transformer, and similar devices. Each component (104a)-(104n) may be the same type of component or different types of components. In the first position, each of the components (104a)-(104n) is shown with a coating applied to an external surface (120a)-(120n) of each component (104a)-(104n). As shown, component (104a) is shown with coating (106a) configured to external surface (120a), component (104b) is shown with coating (106b) configured to external surface (120b), and component (104n) is shown with coating (106n) configured to external surface (120n). In one embodiment, the configuration of the components (104a)-(104n) with the coatings (106a)-(106n) includes a physical contact and physical attachment. The physical attachment may include, but is not limited to, an adhesive bond. In one embodiment, coatings (106a)-(106n) are selectively and individually applied to components (104a)-(104n). For example, at least one component may not have a coating (106a)-(106n). The quantity of component(s), substrate(s), and coating(s) is for illustration purposes only and should not be considered limiting. Accordingly, the coating for each component is applied to an external surface of the component and effectively interfaces between the component and an external surface (118) of the substrate (102).

Each coating (106a)-(106n) is configured with a material that has a transition temperature. In one embodiment, the transition temperature is above a first temperature and below a critical temperature. Exposure of the substrate (102) to a critical temperature may cause damage to the substrate (102). The first temperature is defined as a temperature at which a physical attachment (108a) between the component (104a) and the substrate (102) is mechanically weakened, as described in detail below. In one embodiment, application of the coatings (106a)-(106n) to the components (104a)-(104n) includes a thickness from about 1 millimeter to about 5 millimeters. Accordingly, in this example, components (104a)-(104n) are shown with a coating (106a)-(106n), respectively, applied to an external surface (120a)-(120n) of the associated component, with the coating (106a)-(106n) positioned between the associated component and the substrate (102).

The material may be, but is not limited to, phthalic anhydride, terephthalic acid, and adamantine. In one embodiment, the transition temperature is above about 270 degrees Celsius and below about 500 degrees Celsius. The transition temperature may be, an evaporation temperature and a sublimation temperature. In one embodiment, the transition temperature is a sublimation temperature. For example, phthalic anhydride has a sublimation temperature of 295 degree Celsius, terephthalic acid has a sublimation temperature of 402 degrees Celsius, and adamantine has a sublimation temperature of 270 degrees Celsius. In one embodiment, the sublimation temperature of the material can withstand a solder reflow operation without premature decomposition of the material. In one embodiment, the transition temperature, the evaporation temperature, the sublimation temperature, the critical temperature, and the first temperature are measured at one atmosphere of absolute pressure. In one embodiment, each component (104a)-(104n) may receive a coating (106a)-(106n) with a distinct material composition. For example, the material composition for an individual component may be selected based on a property of the component. Similarly, in one embodiment, the resilient material composition may be selected based on a property of the substrate, or based on a combination of the property of the component and the substrate. In one embodiment, the coating comprises 10 to 20 weight percent of the reaction product of hexamethyldisilazane with silica, 5 to 10 weight percent of methyltrimethoxysilane, 0.1 to 1 weight percent of octamethylcyclotetrasiloxane, 0.1 to 1 weight percent of methanol, 5 to 10 weight percent of phthalic anhydride, 40 to 60 weight percent of polydimethylsiloxane, and 10 to 20 weight percent of silica filler. The coating (106a) may be cured at ambient temperatures (e.g., about 18 to 22 degrees Celsius) or at temperatures above about 100 degrees Celsius. Accordingly, the coatings (106a)-(106n) comprise a material configured to undergo a phase change from the first phase (e.g., solid and/or liquid phase) to a gaseous phase before the substrate (102) is exposed to a critical temperature.

As shown, contacts are provided for each component to support securing the component to the substrate (102) together with enabling electrical communication with the substrate (102). More specifically, component (104a) includes contacts (112a) and (114a), component (104b) includes contacts (112b) and (114b), and component (104n) includes contacts (112n) and (114n). Each of the contacts (112a)-(112n) and (114a)-(114n) are positioned on the external surface (118) of the substrate (102). Furthermore, as shown herein, each of the contacts (112a)-(112n) and (114a)-(114n) are in a first position relative to the substrate (102). The quantity of contact(s) is for illustration purposes and should not be considered limiting. Accordingly, prior to exposure to a thermal event, each component (104a)-(104n) is electrically and mechanically provided in a first position and in communication with the substrate (102).

The substrate (102) may be, but is not limited to, a printed circuit board (PCB), an interposer, and a motherboard. The component contacts (112a)-(112n) may be operatively coupled to the substrate (102) by physical attachments (108a)-(108n), respectively. In one embodiment, component contacts (114a)-(114n) may be operatively coupled to substrate (102) by physical attachments (110a)-(110n), respectively. The coatings (106a)-(106n) are positioned adjacent to the substrate (102). In one embodiment, the coatings (106a)-(106n) are applied to substrate (102) (e.g., physically attached) and positioned adjacent to the components (104a)-(104n). In one embodiment, components (104a)-(104n) are attached to substrate (102) by a solder reflow process. Accordingly, components (104a)-(104n) are operatively coupled to the substrate (102) with a coating positioned between the components (104a)-(104n) and the substrate (102), respectively.

During a solder reflow process, a conductive material is placed on the external surface (118) of the substrate (102). The solder is placed at one or more designated locations (e.g., electrical interface pattern) on the substrate (102) to which the contacts (112a)-(112n) and (114a)-(114n) of the components (104a)-(104n) are to be attached to the substrate (102). The components (104a)-(104n) are placed in communication with, e.g., onto, the substrate (102) with conductive material residing between component contacts (112a)-(112n) and (114a)-(114n) and the electrical interface pattern on the external surface (118) of the substrate (102). An assembly of the substrate (102) and components (104a)-(104n) is subject to a heating process where the assembly encounters a profile of a rising or increased temperature, that in one embodiment reaches a peak temperature above the solder reflow temperature (e.g., liquidus temperature of the conductive material). At the peak temperature, the conductive material is subject to a softening, or in one embodiment, melting, and an electrical connection between the components (104a)-(104n) and the electrical interface pattern may be established. In one embodiment, the peak temperature is below the transition temperature of the material within the coatings (106a)-(106n) to prevent premature degradation of the material (e.g., changes in phase) in joints (108a)-(108n) and (110a)-(110n).

The process is concluded with a cool down period where the conductive material changes to a solid phase (e.g., below the liquidus temperature of the conductive material) to form one or more physical and electrical joints (108a)-(108n) and (110a)-(110n). The conductive material may be, but is not limited to, leaded solder, lead free solder, solder paste, solder wire, and conductive adhesives. In one embodiment, the conductive material is solder composed of 63 weight percent tin and 37 weight percent lead and has a reflow temperature of 183 degrees Celsius. In one embodiment, the solder joints (108a)-(108n) and (110a)-(110n) form an electrical connection between the components (104a)-(104n) and the substrate (102). In one embodiment, the first temperature is the liquidus temperature of solder in at least one of the solder joints (108a)-(108n) and (110a)-(110n). In one embodiment, the first temperature is the reflow temperature of an assembly of the components (104a)-(104n) and the substrate (102). Accordingly, the solder joints (108a)-(108n) and (110a)-(110n) may electrically and mechanically attach the components (104a)-(104n) to the substrate (102).

Referring to FIG. 1, the solder joints (108a)-(108n) and (110a)-(110n) and coatings (106a)-(106n) are at an operating temperature and the material within coatings (106a)-(106n) is in a first phase (e.g., solid and/or liquid phase). The operating temperature is a temperature at which the electrical circuit formed between each component (104a)-(104n) and the substrate (102) is functional. The operating temperature may be a temperature below about 150 degrees Celsius. The substrate (102) may experience damage if the substrate (102) is exposed to a critical temperature. For example, a critical temperature may be caused by a high current event and/or an electrical short in the substrate (102) and/or the components (104a)-(104n). In order to mitigate potential damage to the substrate (102), the material in the coatings (106a)-(106n) is configured to undergo a phase change (e.g., transition process) prior to reaching a critical temperature.

For example, in one embodiment, component (104a) experiences an electrical short while components (104b)-(104n) are not or have not experienced an electrical short. If the electrical short causes the substrate (102) to reach a critical temperature, the functionality and/or physical characteristics of the substrate (102) and/or components (104a)-(104n) may be affected. However, if the discrete failing component (104a) is separated from the substrate (102) before a critical temperature is reached, the substrate (102) may not be affected by the thermal event caused by the electrical short of component (104a) and as such the substrate (102) and components (104b)-(104n) may continue to operate without component (104a). In one embodiment, (104b) is a backup component for (104a). In one embodiment, components (104a) and (104b) are different components. Separation of an individual component, such as component (104a), is referred to herein as discrete removal, which effectively limits removal to an individual component. Accordingly, discrete removal of component (104a) mitigates potential damage to the substrate (102) and/or non-failing components (104b)-(104n).

Figure 2:
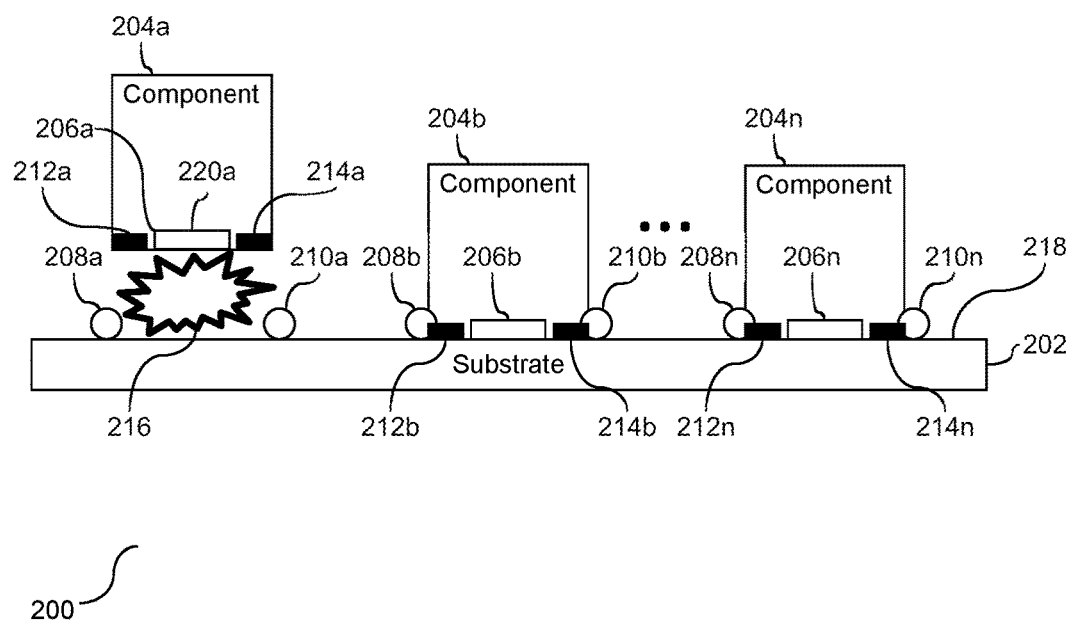
FIG. 2 depicts a block diagram illustrating a phase change of the material and separation of the component from the substrate.

Referring to FIG. 2, a block diagram (200) is provided illustrating separation of a component from the substrate upon exposure to a thermal event. As shown, an electrical short in component (204a) exposes coating (206a) and solder joints (208a) and (210a) to a thermal event. The thermal event causes the temperature of solder joints (208a) and (210a) to increase from the operating temperature to a second temperature above the liquidus temperature of the solder in solder joints (208a) and (210a). This increase of the temperature causes a softening and/or melting of solder joints (208a) and (210a) to where the physical attachment between the component (204a) and the substrate (202) is weakened. The thermal event causes the temperature of the material within coating (206a) to increase from the operating temperature to the second temperature which meets or exceeds the transition temperature of the material. Exposure of the coating (206a) to the thermal event causes the material to undergo a phase change, including changing the material from the first phase (e.g., solid and/or liquid phase) to a gaseous phase. The phase change causes a rapid expansion of the material creating an expanded volume (216) of the gaseous material. In one embodiment, the phase change is a sublimation which bypasses the liquid phase of the material within coating (206a). In one embodiment, the phase change is an evaporation from the liquid phase to the gaseous phase of the material within coating (206a). Accordingly, subjecting the material to the thermal event causes the material to change from the first phase to the gaseous phase.

Due to the weakened physical attachment of the component to the substrate, the expanded volume (216) alters the position of the component (204a). This altered position is referred to herein as a second position, which separates component (204a) from the external surface (218) of substrate (202). The separation is caused by a force associated with the phase change of the material. The force pushes on an external surface (220a) of component (204a) and external surface (218) of substrate (202) to facilitate the separation. In one embodiment, the volume (216) creates an area of pressure (e.g., force) which separates the component (204a) from the external surface (218) of substrate (202). The separation includes an interruption of at least one of solder joints (208a) and (210a). This interruption is an electrical disruption of the electrical connection between the component (204a) and substrate (202). The disruption of the electrical connection caused by the force mitigates the electrical short in the component (204a) which limits any further temperature increases to the substrate (202) and/or component (204a) caused by the electrical short. In one embodiment, the area of pressure is temporary, for example, when the gaseous material diffuses into a surrounding environment the area of pressure is equalized with the surrounding environment. Accordingly, the material discretely separates the component experiencing the thermal event from the substrate in order to mitigate and/or localize potential damage.

Figure 3:
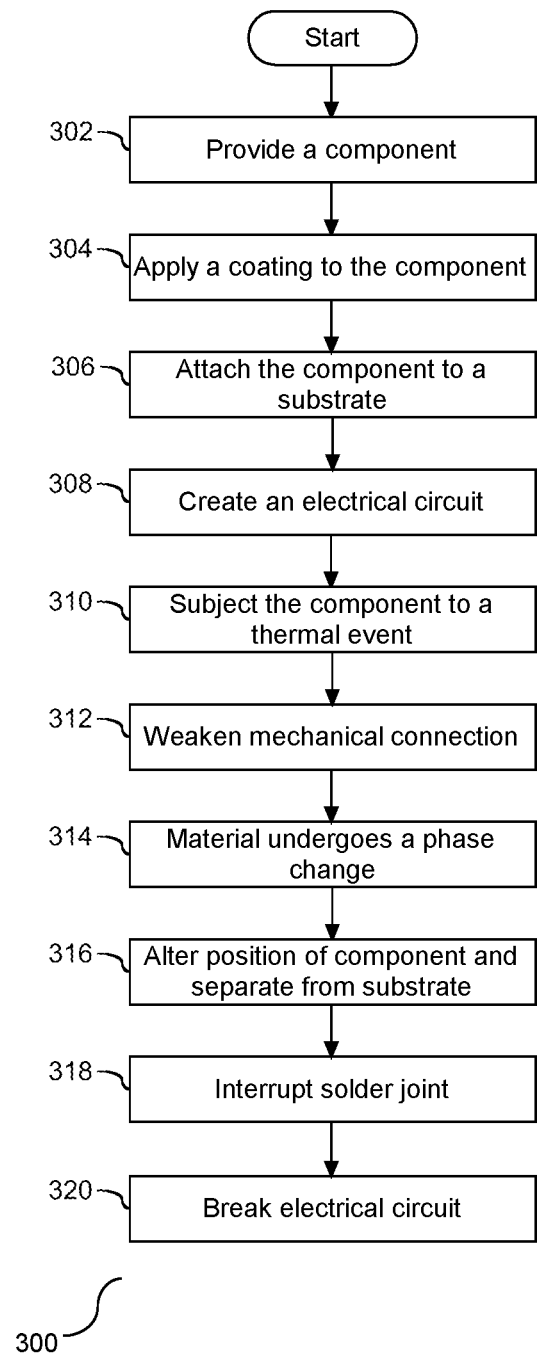
FIG. 3 depicts a flow chart illustrating a process for mitigating damage to the substrate and/or component upon exposure to the thermal event.

Referring to FIG. 3, a flow chart is provided illustrating a process for mitigating damage to a substrate and/or component upon exposure to a thermal event. As shown, a component is provided and prepared to be configured with a coating (302). The coating is applied to the component (304). The coating comprises at least one material in a first phase (e.g., solid and/or liquid phase) with a transition temperature. In one embodiment, the transition temperature is above a first temperature and less than a critical temperature that will cause damage to a substrate and/or component. The first temperature is a temperature which weakens a mechanical attachment between the component and the substrate. In one embodiment, the first temperature is the liquidus temperature of solder used to mechanically and/or electrically attach the component to the substrate. In one embodiment, the first temperature is the reflow temperature of an assembly of the component and the substrate. The material is configured to phase change, e.g., from the solid and/or liquid phase to gaseous phase, in response to exposure of the coating to a temperature of at least the transition temperature. Following application of the coating to the component at step (304), the component is operatively coupled to the substrate in a first position with the coating positioned adjacent to the substrate (306). In one embodiment, step (306) includes a solder reflow process and the forming of a solder joint between the component and the substrate. Formation of the solder joint includes creating an electrical connection between the substrate and the component (308). In one embodiment, the solder joint creates a mechanical attachment between the component and the substrate. Accordingly, following step (306) the substrate and component are physically attached and an electrical circuit created between the substrate and the component is operational.

The coating is subjected to a thermal event that meets or exceeds the transition temperature of the material (310). The thermal event may be caused by an electrical short in the component and/or substrate. Responsive to the thermal event, the mechanical connection between the component and the substrate is weakened (312). In one embodiment, the weakened connection may include a softening and/or melting of the solder joint (312). The material within the coating is subjected to a phase change that includes changing the material from the first phase (e.g., solid and/or liquid phase) to a gaseous phase (314). The phase change creates a rapid volume expansion of the material which physically alters a position of the component from the first position to a second position, including separating the component from the substrate (316). This separation interrupts the solder joint (318) and breaks the electrical circuit formed between the component and the substrate. In addition, the solder joint separation causes the electrical circuit to be non-operational (320). The disruption of the electrical circuit mitigates damage associated with the electrical short. More specifically, the disruption of the electrical communication between the substrate and the component limits further temperature increases to the substrate and/or component which may cause damage to the affected component, other components, and/or substrate. Accordingly, the component is configured with a material which enables discrete separation of the component from the substrate in order to isolate and/or localize damage.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications as are suited to the particular use contemplated. Accordingly, the implementation of a coating with a material configured to undergo a transition process can be used to limit damage to a discrete component of a substrate.

It will be appreciated that, although specific embodiments have been described herein for purposes of illustration, various modifications may be made without departing from the spirit and scope of the embodiments. In particular, any type of component may be used in association with the spirit and scope of the embodiment. The component may be an electrical device, a socket, and or a mechanical attachment between a secondary body and substrate. Additionally, the embodiments may apply to non-electronic heat sensitive components positioned in communication with or operatively coupled to a substrate. Accordingly, the scope of protection of the embodiments is limited only by the following claims and their equivalents.

What is claimed is:

1. An apparatus comprising:
   a component operatively coupled to a substrate in a first position;
   a coating applied to the component and positioned adjacent to the substrate, the coating comprising:
      a material in a first phase having a transition temperature, wherein the transition temperature of the material is about 270 degrees Celsius;
   responsive to exposure of the coating to a thermal event meeting or exceeding the transition temperature, the material subject to a phase change from the first phase to a second phase, wherein the phase change interrupts a solder joint; and
   the phase change to alter the position of the component from the first position to a second position, wherein the second position is a separation of the component from the substrate.

2. The apparatus of claim 1, wherein the material is selected from the group consisting of: phthalic anhydride, terephthalic acid, and adamantine.

3. The apparatus of claim 1, wherein the coating has a thickness of about 1 to 5 millimeters.

4. The apparatus of claim 1, wherein the phase change is a transition process to expand a volume of the material from a first volume to the second volume.

5. The apparatus of claim 4, wherein the thermal event is in response to an electrical short in the component.

6. The apparatus of claim 1, wherein the separation of the component from the substrate is isolated to the component and the applied coating.

7. The apparatus of claim 6, wherein the coating further comprises at least one material selected from the group consisting of: a reaction product of hexamethyldisilazane with silica, methyltrimethoxysilane, octamethylcyclotetrasiloxane, methanol, polydimethylsiloxane, and silica.

8. The apparatus of claim 1, wherein the thermal event includes a temperature increase of a part to a second temperature above a solder reflow temperature and below a critical temperature of the substrate, the part selected from the group consisting of: the substrate and the component.

9. The apparatus of claim 1, wherein a maximum transition temperature of the material about 500 degrees Celsius.

10. An apparatus comprising:
    a component operatively coupled to a substrate in a first position;
    a coating applied to the component and positioned adjacent to the substrate, the coating comprising:
       a material in a first phase having a transition temperature, wherein the transition temperature of the material is about 270 degrees Celsius;
    responsive to exposure of the coating to a thermal event meeting or exceeding the transition temperature, the material subject to a phase change from the first phase to a second phase; and
    the phase change to force the position of the component from the first position to a second position, wherein the second position is a separation of the component from the substrate.

11. The apparatus of claim 10, further comprising the force to push on the component and the substrate to facilitate the separation.

12. The apparatus of claim 10, wherein the component is operatively coupled to the substrate in the first position via a solder joint.

13. The apparatus of claim 12, wherein the separation further comprises an interrupt of the solder joint.

14. An apparatus comprising:
- a component operatively coupled to a substrate in a first position;
- a coating applied to the component and positioned adjacent to the substrate, the coating comprising:
  - a material in a first phase having a transition temperature, wherein the transition temperature of the material is about 270 degrees Celsius;
- responsive to exposure of the coating to a thermal event meeting or exceeding the transition temperature, the material subject to a phase change from the first phase to a second phase;
- the phase change to alter the position of the component from the first position to a second position, wherein the second position is a separation of the component from the substrate; and the separation of the component from the substrate is isolated to the component and the applied coating.

15. The apparatus of claim 14, further comprising a solder joint to operatively couple the component to the substrate, and wherein the phase change interrupts the solder joint.

16. The apparatus of claim 14, wherein the phase change is a transition process to expand a volume of the material from a first volume to the second volume.

17. The apparatus of claim 14, wherein the thermal event is in response to an electrical short in the component.

18. The apparatus of claim 14, wherein the thermal event includes a temperature increase of a part to a second temperature above a solder reflow temperature and below a critical temperature of the substrate, the part selected from the group consisting of: the substrate and the component.

19. The apparatus of claim 14, wherein the coating has a thickness of about 1 to 5 millimeters.

20. The apparatus of claim 14, wherein a maximum transition temperature of the material is above about 500 degrees Celsius.

* * * * *